United States Patent [19]

Bryskiewicz et al.

[11] Patent Number: 5,011,564
[45] Date of Patent: Apr. 30, 1991

[54] EPITAXIAL GROWTH

[75] Inventors: Barbara G. Bryskiewicz; Tadeusz R. Bryskiewicz, both of Watertown; Ferdynand P. Dabkowski; Jacek Lacowski, both of Woburn; Harry C. Gatos, Weston, all of Mass.

[73] Assignee: Massachusetts Institute of Technology, Cambridge, Mass.

[21] Appl. No.: 324,900

[22] Filed: Mar. 17, 1989

Related U.S. Application Data

[63] Continuation of Ser. No. 121,513, Nov. 17, 1987, abandoned, which is a continuation of Ser. No. 868,136, May 28, 1986, abandoned.

[51] Int. Cl.$^5$ .............................................. C30B 9/06
[52] U.S. Cl. ................................... 156/624; 156/621; 156/DIG. 70; 156/DIG. 72; 156/DIG. 81; 156/DIG. 92; 156/DIG. 94; 156/DIG. 110; 252/62.3 GA
[58] Field of Search ............... 156/621, 624, DIG. 70, 156/DIG. 72, DIG. 81, DIG. 92, DIG. 94, DIG. 110; 148/DIG. 66; 252/62.3 GA; 437/122

[56] References Cited

U.S. PATENT DOCUMENTS

| | | | |
|---|---|---|---|
| 3,496,118 | 2/1970 | Willardson et al. | 156/624 |
| 3,630,693 | 12/1971 | Moody et al. | 156/621 |
| 3,647,578 | 3/1972 | Barnett et al. | 156/621 |
| 3,677,228 | 7/1972 | Panish et al. | 156/DIG. 70 |
| 3,762,943 | 10/1973 | Winstel et al. | 156/621 |
| 3,791,887 | 2/1974 | Deitch | 252/62.3 GA |
| 3,859,178 | 1/1975 | Logan et al. | 156/622 |
| 3,950,195 | 4/1976 | Rode et al. | 156/622 |
| 4,026,735 | 5/1977 | Kamath et al. | 252/62.3 GA |
| 4,142,924 | 3/1979 | Hsieh | 437/122 |
| 4,283,247 | 8/1981 | Roques et al. | 156/624 |
| 4,529,027 | 7/1985 | Brice et al. | 156/622 |

FOREIGN PATENT DOCUMENTS 2719040 11/1977 Fed. Rep. of Germany ..... 252/62.3 GA Primary Examiner—Olik Chaudhuri
Assistant Examiner—Robert M. Kunemund

[57] ABSTRACT

An equilibrium growth dispersion for use in liquid epitaxial growth at a predetermined growth temperature of a compound including at least two constituents. Predetermined quantities each of the constituents are placed in a container, the predetermined quantities being such that the total relative proportions of constituents will provide a saturated solution of one of the constituents in another of the constituents at the growth temperature, and the container with the predetermined quantities therein is heated to a temperature not less than the growth temperature to dissolve the constituents and is maintained at such a temperature for a period of time sufficient to produce a solution of one of the constituents in the other. The solution is then rapidly solidified, typically by quenching, to form the equilibrium growth dispersion which comprises an essentially homogeneous dispersion of particles of the one constituent (the solute) in the other (the solvent).

18 Claims, 4 Drawing Sheets

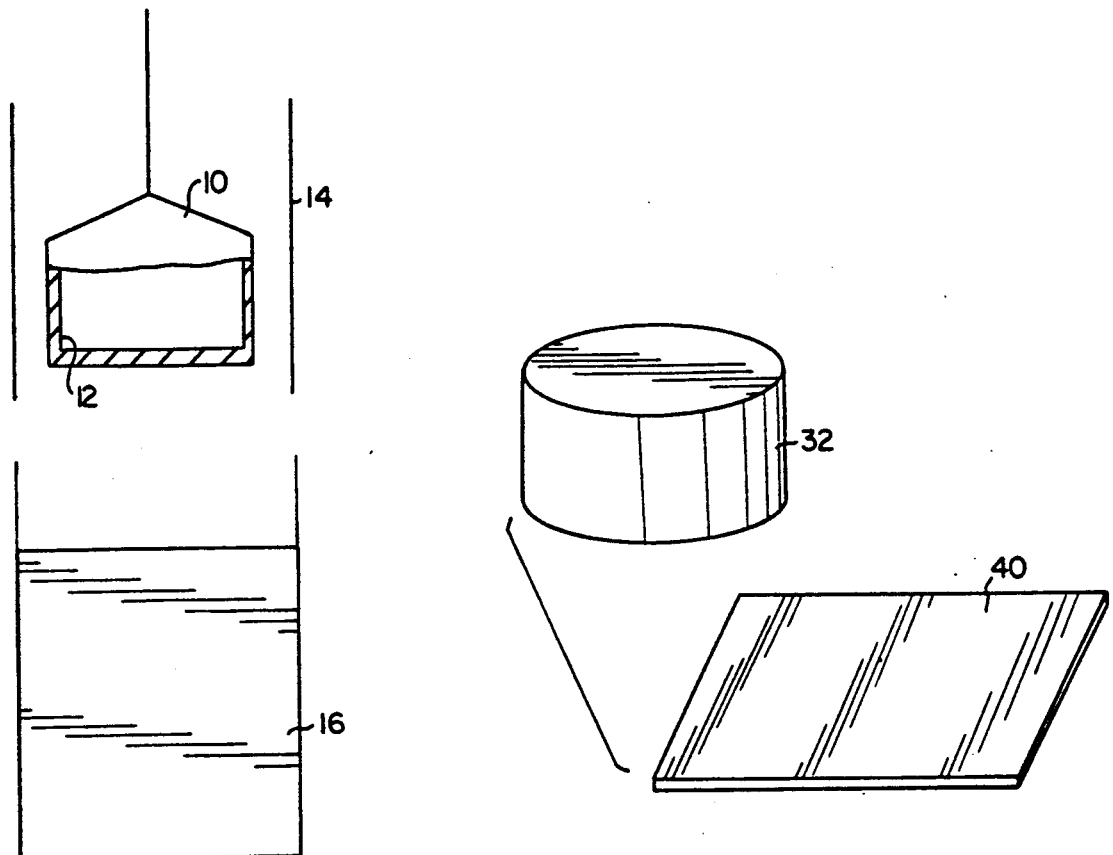
FIG. 1
FIG. 2A
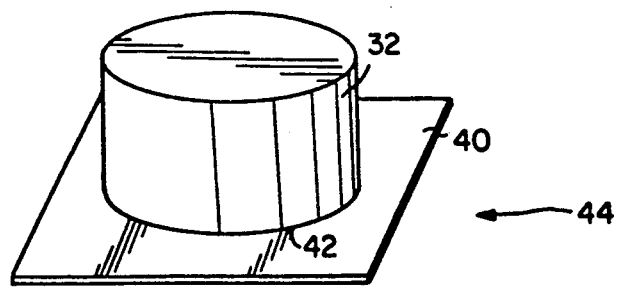
FIG. 2B

EPITAXIAL GROWTH

This application is a continuation of 07/121,513 filed on Nov. 17, 1987, now abandoned, which is a continuation of 06/868,136 filed on May 28, 1986, now abandoned.

FIELD OF THE INVENTION

This invention relates to materials growth and, more particularly, to epitaxial growth.

BACKGROUND OF THE INVENTION

There are a number of processes for epitaxial growth of various II-VI, III-V, and IV-VI compounds (including mixed compounds). U.S. Pat. No. 4,186,045, which is here incorporated by reference, discloses a method of liquid phase epitaxial growth in which such compounds are grown from a solution by precipitation of the constituents of the solution onto a seed or substrate. In the method there described, the substances of which the material is formed are melted together to provide a liquid solution that includes the constituents of the material, the solution is brought into contact with the appropriate seed or substrate, and the material to be grown is then precipitated from the solution onto the interface between the solution and seed. In the process of the patent, precipitation is effected by electromigration. In other epitaxial growth systems it is caused by other mechanisms, such as Peltier cooling at the seed-solution interface.

In epitaxial growth processes the solution from which growth proceeds must be in equilibrium, i.e., it must be a saturated solution of the constituents of the to-be-grown compound, at the growth temperature. The growth temperature is typically well below the melting point of the compound, the relative percentages of the constituents present in the saturated solution is typically quite different from that in the compound produced, and the solubility of one or more of the constituents in another also varies with temperature.

All of this makes it difficult to provide the necessary equilibrated solution. Typically, it has been necessary to heat the solution out of contact with the seed or substrate, and not to bring the two into contact until equilibrium at the growth temperature has been achieved; or carefully to add one or more constituents to the solution as it is being heated, in an effort continuously to maintain a saturated solution despite continuing changes in the conditions necessary for equilibrium and to avoid undesirable reaction between the solution constituents and the substrate. Neither procedure is satisfactory for automated or relatively high-level production process. The problems presented are particularly acute when, for example, the planned automated growth is to take place in space.

SUMMARY OF THE INVENTION

It has been discovered that equilibrium between the solution and seed at the growth temperature can be assured, and many of the problems heretofore standing in the way of automated epitaxial growth in space overcome, by providing a previously-prepared, essentially homogeneous, dispersion of particles of one or more of the constituents of the to-be-grown compound in another of the constituents, the overall relative quantities of the constituents being such as to provide a saturated solution of the constituents at the planned growth temperature. Such a dispersion is typically solid at room temperature, and hereinafter is referred to as an "equilibrium growth dispersion".

One aspect of the present invention features forming such an equilibrium growth dispersion by heating the constituents of the to-be produced compound in the desired predetermined proportions to above the temperature at which growth will occur, homogenizing the mixture, and then rapidly quenching it. In a second aspect, such as equilibrium growth dispersion is placed in intimate contact with the substrate seed or on which growth will proceed, the growth dispersion and substrate are heated to a temperature above the melting point of the constituent that is the major component of the equilibrium growth dispersion to provide complete wetting between the dispersion and substrate, and both are then cooled to bond the dispersion and substrate together into a unitary growth assembly. One of the constituents may be, e.g., arsenic, phosphorous, antimony or cadmium; another may be, for example, gallium, indium, tin or tellurium.

Preferred practices of the invention include both aspects, and feature also heating the dispersion and the substrate under vacuum to a temperature sufficient to vaporize and permit removals of hydroxide or oxide impurities, but below the temperature of which any of the constituents is significantly (e.g., greater than about 0.05%) soluble in any other, prior to placing the dispersion into contact with the substrate.

The invention is particularly useful in connection with the epitaxial growth of binary and mixed II-VI, III-V, and IV-IV compounds. Exemplary such compounds include materials grown from a saturated solution in which tellurium is the solvent and major constituent and in which smaller amounts of any other constituents are dissolved (such as CdTe, HgCdTe, MnTe, PbTe and PbSnTe), materials grown from a saturated solution of other constituents in selenium (such as CdSe), and materials grown from saturated solutions in which the solvent is gallium or indium (such as GaAs, GaAlAs, GaP, GaSb, GaAlP, GaAlSb, InSb, InAs and InP), together with other compounds which the aforementioned U.S. Pat. No. 4,186,045 says may be produced using the electroepitaxial growth process described therein.

DESCRIPTION OF DRAWINGS

FIG. 1 schematically illustrates a system useful for producing an equilibrium growth dispersion.

FIGS. 2a and 2b schematically illustrate a procedure for forming the desired interface between an equilibrium growth dispersion pellet and a substrate.

DETAILED DESCRIPTION OF THE INVENTION

Figure 3:
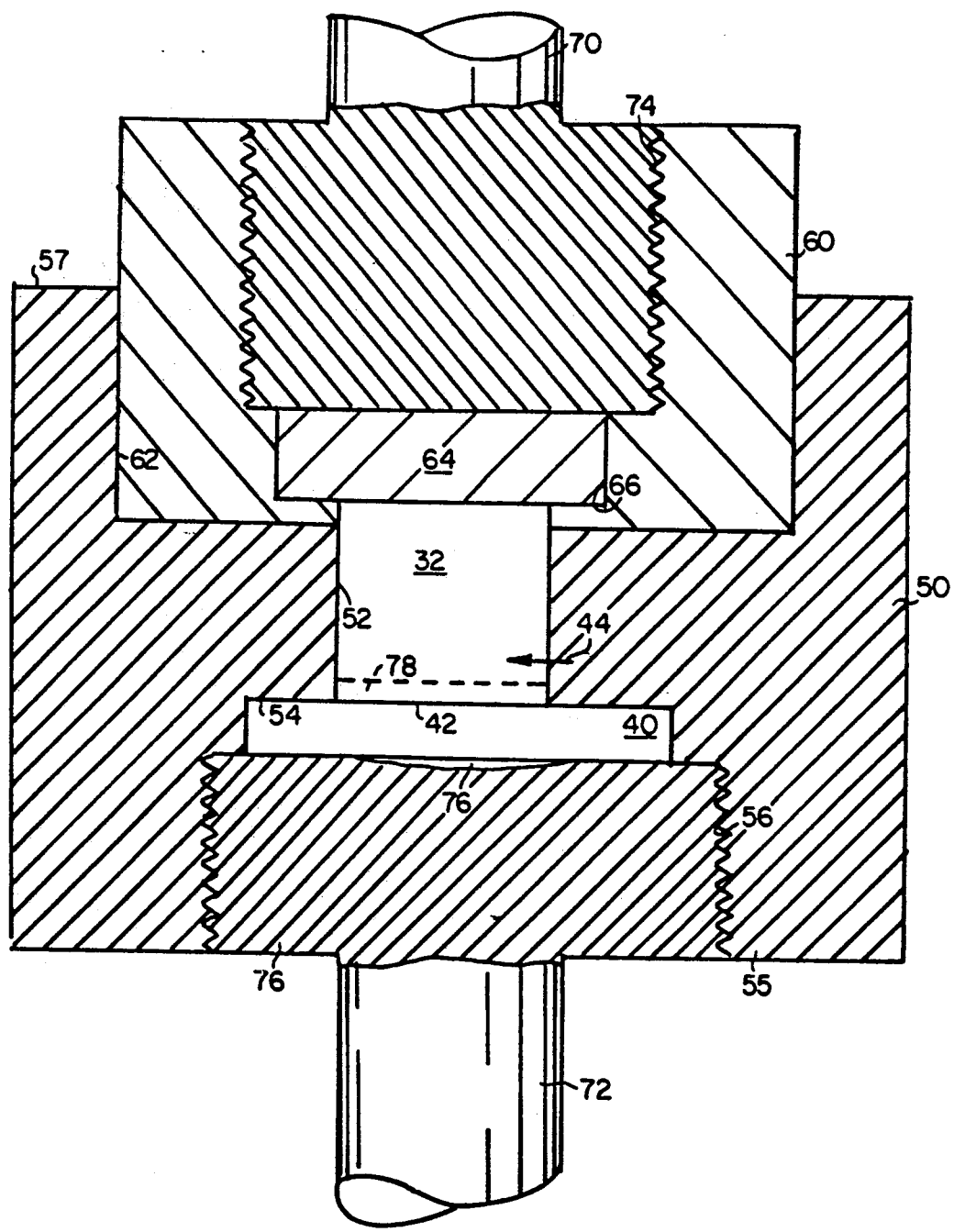
FIG. 3 schematically illustrates epitaxial growth from the pellet-substrate assembly of FIG. 2.

Referring now to FIG. 1, a quartz ampoule 10 is cleaned and its inner surfaces 12 pyrolitically covered with a thin layer of carbon. Predetermined quantities of the constituents of the compound to be grown are cleaned, weighed, and placed within the ampoule. The relative percentages of the constituents are chosen so that, when melted together at the temperature at which growth is to take place, they will produce an equilibriated, i.e., saturated, solution of the constituents. The exact relative proportions chosen will depend, of course, on the particular compound and selected growth temperature.

The ampoule, with the constituents in it, is evacuated (typically to a pressure of $5 \times 10^{-6}$ torr or less), and sealed in such a way as to minimize the free space above the charge. The sealed ampoule 10 is then placed into a furnace 14, as shown in FIG. 1, and the furnace is heated to a temperature 30 to 50 degrees above the planned growth temperature. Theoretically, the entire charge within the ampoule would melt and form a saturated solution at the planned growth temperature. The 30 to 50 degree superheat insures total dissolution. After the constituents have been dissolved, the charge is homogenized at the superheat temperature for a period of 24 hours, typically by slow rotation of the ampoule 10 about its vertical axis while it is in place within the furnace 14.

When homogenization is complete, the ampoule 10 containing the essentially saturated solution is rapidly quenched, preferably by dropping it out of the bottom of the furnace 14 into an iced water bath 16. Since the solubility of the constituent(s) forming the minor fractions, of the solution (i.e., the solute(s)). in the material forming the major fraction (i.e., the solvent,) typically decreases with decreasing temperature, it will be recognized that normal cooling of a saturated solution would result in precipitation of particles of the solute constituent(s); the resulting product at room temperature would be various sized particles of the solute constituent(s) unevenly distributed through (typically on the top of) the major fraction constituent (the solvent). Rapid quenching prevents such precipitation. As previously indicated, the quenched product (i.e., the equilibrium growth dispersion) is an essentially homogeneous dispersion of fine particles of the solute constituent(s) (e.g., the constituent(s)) forming the minor fraction of the saturated solution in the solvent (e.g., the major) fraction constituent. Typically, even when the major fraction constituent is a low melting point material such as gallium, the dispersion is solid at room temperature.

The solid-at-room-temperature equilibrium growth dispersion is then removed from the ampoule, typically by breaking the ampoule; and thereafter may be used to provide the solution from which epitaxial growth of the desired compound will proceed.

Referring now to FIG. 2, the equilibrium growth dispersion from ampoule 10 provides a disc-shaped pellet, designated 32, which may be placed on the substrate 40 upon which epitaxial growth is to proceed. For successful epitaxial growth, there should be complete wetting of the substrate 40 by the growth solution. Without such complete wetting, e.g., if any bubbles of trapped gas or other impurities exist at the interface 42 between the equilibrium growth dispersion pellet 32 and the substrate 40, proper growth will not be accomplished.

Complete wetting, and elimination of possible impurities at the interface 42, is accomplished by placing both the substrate 40 and pellet 32 in a furnace (not shown) and heating, under reduced pressure, to a temperature sufficient to vaporize and remove impurities (FIG. 2A). For example, such heating may convert hydroxides of one of the constituents to an oxide which will vaporize and be removed from the system. While the system is still at elevated temperature, the furnace chamber is filled with pure inert gas and the pellet 32 is placed on and lightly pressed into contact with the substrate 40 (FIG. 2B). It will be recognized that the temperature sufficient to vaporize and remove impurities is (or alternatively the furnace temperature will be increased to) above the melting point of the major constituent (i.e., the solvent) of the equilibrium growth dispersion.

The pellet 32 and substrate 40 are then pressed together, eliminating any trapped gas bubbles between the pellet and the substrate and insuring that there is complete wetting of the substrate-pellet interface. The pellet-substrate structure is then cooled, resolidifying pellet 32 and bonding it to the substrate, thus forming a unitary pellet-substrate assembly 44 that can be loaded into the growth system.

In those circumstances in which the purity of the substrate and pellet are such that initial removal of varporizable impurities is not required, the substrate and pellet are simply heated and then brought into contact with each other in an inert gas atmosphere. Heating, typically to a temperature of between 10 and 30 degrees above the melting point of the major constituent, causes slight melting and the pellet and substrate may then be pressed together to form the desired void-free interface. On cooling, the two bond together and form the unitary pellet-substrate assembly.

Reference is now made to FIG. 3 which illustrates, somewhat schematically, a system for conducting epitaxial growth using the pellet-substrate assembly 44 of the present invention. As shown, the pellet-substrate assembly 44 is fitted into a stepped, cylindrical boron-nitride housing 50, with the growth pellet 32 fitting closely into a central axial bore 52 of housing 50 and the substrate 40 fitted into an annular recess 54 in the base of a threaded cylindrical cavity 56 in the bottom 55 of housing 50. At the top 57 of housing 50, a cylindrical graphite insert 60 fits into a cavity 62, coaxial with bore 52, recess 54 and cavity 56. A replenished source 64 (e.g., a source of the minor fraction constituent(s) which will melt and during growth will provide the additional material necessary to maintain the growth solution at equilibrium as growth proceeds) is placed on top of the pellet 32 of the pellet-substrate system 44, in an annular recess 66 in the base of a cavity 74 in insert 60. Cylindrical graphite electrodes 70, 72 are screwed into place in cavities 74 and 56, with the upper electrode 70 contacting the top of source 64 and the lower electrode 72 in contact with substrate 40. To insure the desired uniform electrical contact between electrode 72 and substrate 40 a conductive contact layer 76 (typically a material, such as gallium to which some aluminum has been added, that will melt and provide complete wetting and electrical contact) is provided between the electrode 72 and substrate 54.

The complete assembly (typically already provided in a furnace (not shown)) is then heated to the desired growth temperature, typically under reduced pressure. The pellet 32 melts during heat-up and forms a solution, supersaturated at temperatures below the growth temperature and saturated and in thermodynamic equilibrium with both the substrate 40 and replenishing source 50 when the growth temperature is reached.

When the desired growth temperature has been reached, electric current is applied across electrodes 70, 72, as taught in the aforementioned U.S. patent, causing the compound constituents in the saturated solution provided by pellet 32 to precipitate onto the interface 42 between the solution and the substrate, forming the desired compound (schematically indicated at 78).

As is well known, the relative percentages of the constituents in the compound being grown is typically very different from that in the saturated solution. For example, in previously listed II-VI, III-V and IV-VI binary compounds include equal atomic percentages of each constituent, but at the growth temperature the saturated solution from which a compound is grown, typically will contain far more of one compound (the solvent) than the other (the solute). Thus, as is also well recognized, the solute in the solution must be continuously replenished with material from replenishing source 64 as growth proceeds.

It will be recognized that use of a solid equilibrium growth dispersion greatly simplifies many aspects of liquid phase epitaxial growth, both by making it unnecessary to adjust the relative proportions of the growth solution during heat up and by making it unnecessary to keep the growth solution and substrate out of contact with each other until the solution has been equilibrated at the growth temperature. By using such equilibrium growth dispersions, it is possible, for example, to preload a number of growth charges and, either on earth or in space, greatly automate the succeeding growth procedures.

It also has been found that equilibrium growth dispersion pellets 32 produced as shown in FIG. 1 may easily be combined or reshaped. Such combining and reshaping may be accomplished by placing one or more pellets 32 (the number depending on the desired total solution required for subsequent crystal growth) in a quartz reforming ampoule of the desired diameter (the inside of the reforming ampoule, like ampoule 10, is typically pyrolitically coated with a layer of carbon), and then heating the reforming ampoule with the pellet(s) in it to a temperature some 50 to 70 degrees above the melting point of the major constituent of the pellet(s); but below that which the solute constituent(s) is, to any significant extent, soluble in the major fraction constituent (the solvent). At such a temperature, the equilibrium growth dispersion pellet(s) will melt sufficiently to flow and form new growth pellet of diameter equal to that of ampoule 30, and upon subsequent cooling, the mixture will remain an essentially homogeneous dispersion of fine particles of the minor constituent(s) in the major constituent, i.e., an equilibrium growth dispersion, typically solid at room temperature.

Figure 4:
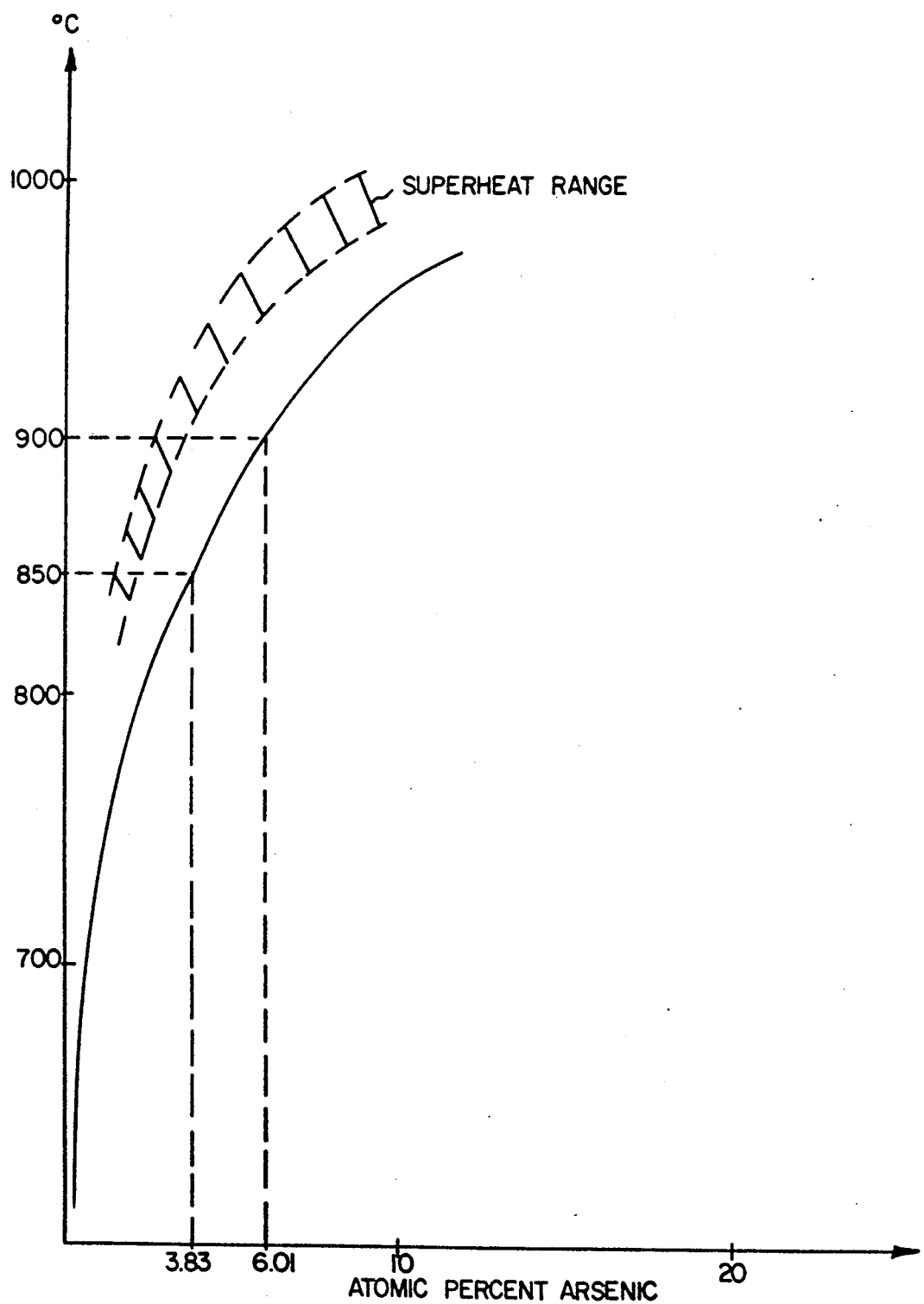
FIGS. 4 and 4A are gallium-arsenic phase diagrams.
Figure 4A:
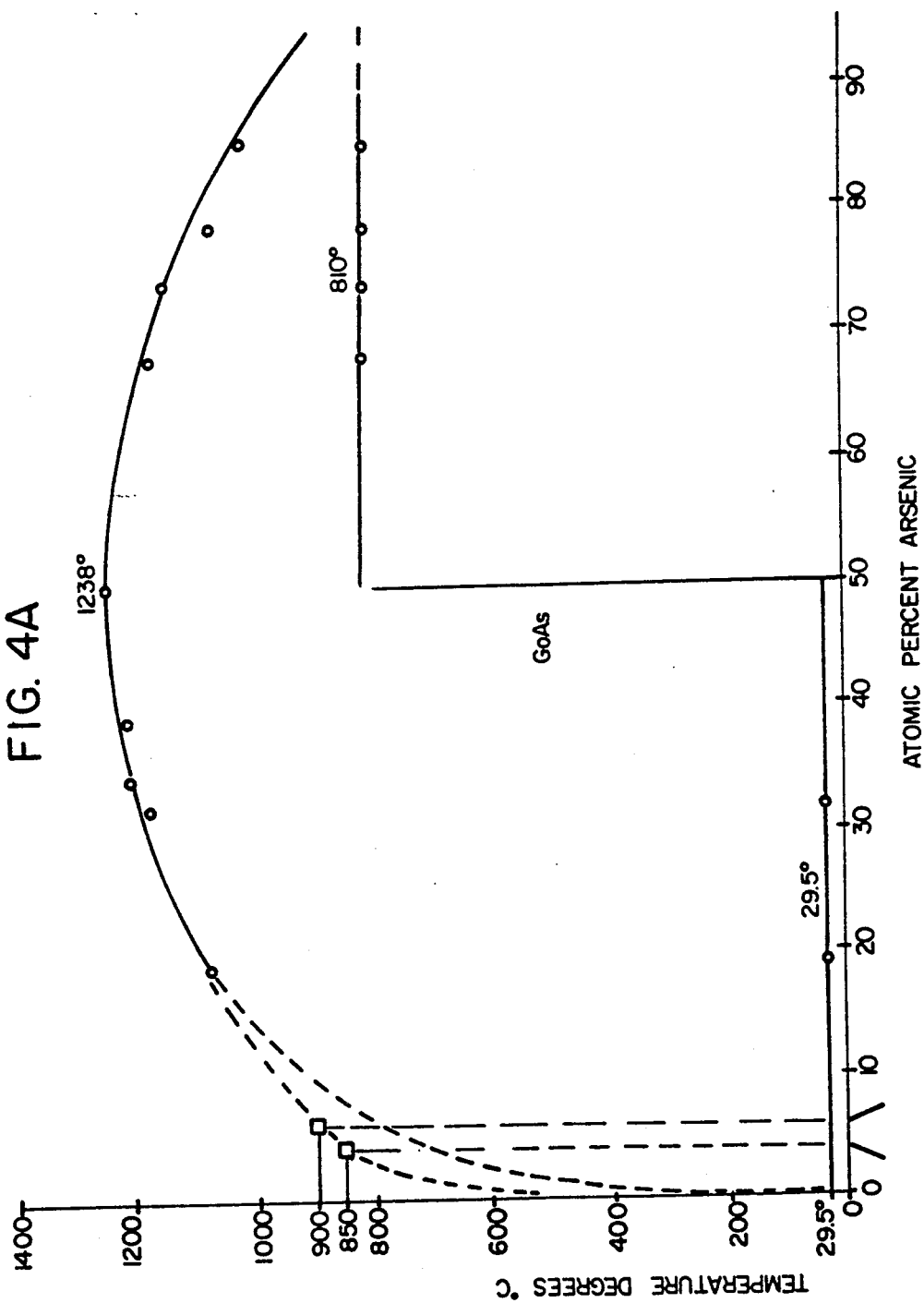

One particular useful application of the above-described invention is in the growth of gallium arsenide. In such growth, predetermined quantities of gallium and either elemental arsenic or gallium arsenide are cleaned, weighed, and placed within the ampoule 10 of FIG. 1. The relative percentages of gallium and arsenic or gallium arsenide to be loaded into ampoule 10 are determined from the phase diagrams of FIGs. 4 and 4A. If, for example, the epitaxial growth process is to be accomplished at a temperature of 850 degrees Centigrade, it will be seen from the phase diagrams of FIGS. 4 and 4A that an equilibrium solution at that temperature contains about 3.83% (by atomic percent, e.g., the atomic fraction expressed as a percent) arsenic and 96.17% gallium. Thus, for equilibrium at 850 degrees C., the amount of arsenic (or gallium arsenide which is, of course, 50% arsenic and 50% gallium by atomic percent) added to the gallium is chosen so that the total amount of arsenic in the ampoule is, by atomic percent, equal to 3.83% of the total. At other growth temperatures, equilibrium is provided by different relative proportions. Thus, by way of example, an equilibrium growth dispersion for epitaxial growth at 850° C., may be proposed by heating together 0.26 grams of gallium arsenide and 3 g. of gallium; while, by way of comparison, an equilibrium growth dispersion for growth at 900° C. may be prepared, by adding 0.43 g. of GaAs to 3 grams of gallium so that to provide a total amount of arsenic in the saturated solution will be equal to 6.01% (again by atomic weight) of the total (e.g., the atomic percent of gallium will be 93.99%).

As previously discussed, melting and homogenization of the materials in the ampoule is provided by heating to about 880°-900° C. (i.e., 30 to 50 degrees C. above the planned 850° C. growth temperature) for a period of 24 hours; and the ampoule is then quenched. The resulting desired equilibrium growth dispersion consists of fine particles of arsenic (with, perhaps, a minor amount of gallium arsenide particles) uniformly dispersed throughout the gallium).

Complete wetting, and elimination of possible impurities at the interface 42 between the gallium arsenide equilibrium growth dispersion pellet 32 so formed and a gallium arsenide substrate 40 is preferably accomplished by placing both the substrate 40 and pellet 32 in a furnace (not shown) and heating, under reduced pressure, to about 400-500 degrees C. (as discussed previously and shown in FIG. 2A) Such heating converts any gallium hydroxide present to gallium oxide, and the oxide vaporizes and is removed from the system. While the system is still at elevated temperature, the pellet 32 and substrate are placed in contact with each other, and the system is then cooled, thus providing the desired pellet-substrate assembly 44 (as shown in FIG. 2B).

Other embodiments will be within the scope of the following claims.

What is claimed is:

1. The process of forming an equilibrium growth dispersion for use in the liquid epitaxial growth at a growth temperature of a compound including at least two constituents, the melting point of one of said constituents being higher than that of another of said constituents and the relative solubility of said constituents being such that cooling saturated solutions thereof tends to cause precipitation of particles of the solute constituent, said process comprising the steps of:

placing each of said constituents in a container in a quantity such that the total relative proportions of constituents will provide a saturated solution of one of said constituents (the solute constituent) in another of said constituents (the solvent constituent) at said growth temperature;

heating said container with said constituents therein a temperature not less than the growth temperature to dissolve said constituents and maintaining said container with said container with said constituents therein at a temperature not less than said growth temperature for a period of time sufficient to produce a solution of said solute constituent in said solvent constituent; and rapidly quenching the contents of said container at a rate of cooling sufficiently rapid to prevent said precipitation of particles of said solute constituent and to form a said equilibrium growth dispersion comprising an essentially homogeneous dispersion of fine particles of said solute constituent in and throughout said solvent constituent.

2. The process of claim 1 wherein said equilibrium growth dispersion is solid at room temperature.

3. The process of claim 1 including the step of thereafter reheating said equilibrium growth dispersion to said growth temperature to provide a saturated solution of said one of said constituents in said another of said constituents.

4. The process of claim 1 wherein said container with said constituents therein is heated to a temperature not less than about 30 degrees greater than said growth temperature.

5. The process of claim 1 wherein said container with said constituents therein is maintained at said temperature not less than said growth temperature for a period of not less than about 10 hours.

6. The process of claim 1 wherein the quantity of one of said constituents placed in said container is, by atomic weight, less than the quantity of another of said constituents placed in said container.

7. The process of claim 1 wherein the relative amount of said one of said constituents in said solution is less than the relative amount of said one constituent in said compound.

8. The process of claim 1 wherein said growth process is an epitaxial growth process, said growth temperature is not over about 1000 degrees Centigrade, and the quantity of said one of said constituents is, by atomic weight, less than about 10 percent of the quantity of said another of said constituents.

9. The process of claim 1 wherein the contents of said container are rapidly solidified by quenching.

10. The process of claim 1 wherein said another constituent is selected from the group consisting of gallium, indium, tin and tellurium.

11. The process of claim 1 wherein said another constituent is gallium, said one constituent is arsenic, and said compound is gallium arsenide.

12. In the process of liquid phase epitaxial growth of a compound including at least two constituents in which a saturated solution of one of the constituents (the solute constituent) in another of the constituents (the solvent constituent) is provided adjacent a substrate at a growth temperature and said constituents of said solution are precipitated onto said substrate to form said compound, that improvement comprising the steps of:
   providing an equilibrium growth dispersion of said constituents;
   placing said dispersion in contact with said substrate at a temperature below the temperature at which said growth is to be conducted; and
   heating said dispersion to said growth temperature while it is in contact with said substrate,
   said equilibrium growth dispersion comprising an essentially homogeneous dispersion of fine particles of said solute constituent in and throughout said solvent constituent, the relative proportions of said constituents being such as to provide at said growth temperature (i) a saturated solution of said solute constituent in said solvent constituent, and (ii) thermodynamic equilibrium between said solution and said substrate.

13. The process of claim 1 including the further steps of providing a substrate, placing said equilibrium growth dispersion adjacent said substrate, heating said substrate and said equilibrium growth dispersion in vacuum to a temperature greater than approximately 450 degrees C., and thereafter bringing said dispersion into contact with said substrate.

14. The process of claim 1 including the further steps of providing a substrate, placing said equilibrium growth dispersion adjacent said substrate, heating said substrate and said equilibrium growth dispersion in vacuum to a temperature greater than approximately 10 degrees C. above the melting point of said another constituent, and thereafter bringing said dispersion into contact with said substrate.

15. The process of claim 1 in which said equilibrium growth dispersion consists essentially of gallium and arsenic and including the steps of providing said dispersion adjacent a substrate, heating said dispersion and said substrate in an inert atmosphere to a temperature in the range of about 400 to 500 degrees Centigrade and while at said temperature bringing said dispersion and substrate into contact with each other to insure that said dispersion wets substantially the entire interface between said dispersion and said substrate.

16. The process of claim 15 wherein, after said dispersion and said substrate have been brought into contact with each other, the temperatures thereof are reduced to room temperature whereby said dispersion and substrate are bonded to each other.

17. The process of claim 1 including the further steps of placing at least one equilibrium dispersion, solid at room temperature, in a container the interior configuration of which is different from the configuration of said dispersion,
   heating said container and said dispersion under vacuum to a temperature greater than the melting point of said another constituent but below the temperature at which the solubility of said one constituent in said another constituent is greater than 0.05%, whereby said solid dispersion conforms to the configuration of said container, and
   reducing the temperature to re-solidify said dispersion into an equilibrium growth dispersion solid at room temperature and having the configuration of said container, and removing said reformed solid dispersion from said container.

18. The process of claim 17 wherein a plurality of said solid dispersions are placed in said container, and wherein said container is quartz and the inner surfaces thereof in contact with said solid dispersions are coated with carbon.

* * * * *

UNITED STATES PATENT AND TRADEMARK OFFICE
CERTIFICATE OF CORRECTION

PATENT NO. : 5,011,564
DATED : April 30, 1991
INVENTOR(S) : Bryskiewicz et al

It is certified that error appears in the above—identified patent and that said Letters Patent is hereby corrected as shown below:

Column 4, line 35, "replenished" should be --replenishing--.

Column 6, line 52 (Claim 1), delete "with said container".

Signed and Sealed this

Third Day of August, 1993

Attest:

MICHAEL K. KIRK

*Attesting Officer*  *Acting Commissioner of Patents and Trademarks*